US012757639B2

(12) United States Patent
Filippou et al.

(10) Patent No.: US 12,757,639 B2
(45) Date of Patent: Oct. 6, 2026

(54) SEED LAYER FOR ENHANCING TUNNEL MAGNETORESISTANCE WITH PERPENDICULARLY MAGNETIZED HEUSLER FILMS

(71) Applicants: INTERNATIONAL BUSINESS MACHINES CORPORATION, Armonk, NY (US); Samsung Electronics Co., Ltd., Suwon-si (KR)

(72) Inventors: Panagiotis Charilaos Filippou, Fremont, CA (US); Chirag Garg, San Jose, CA (US); Mahesh Samant, San Jose, CA (US); . Ikhtiar, San Jose, CA (US); Jaewoo Jeong, Los Altos, CA (US)

(73) Assignees: INTERNATIONAL BUSINESS MACHINES CORPORATION, Armonk, NY (US); SAMSUNG ELECTRONICS CO., LTD., Suwon-si (KR)

( * ) Notice: Subject to any disclaimer, the term of this patent is extended or adjusted under 35 U.S.C. 154(b) by 765 days.

(21) Appl. No.: 18/179,588

(22) Filed: Mar. 7, 2023

(65) Prior Publication Data

US 2024/0155950 A1 May 9, 2024

(30) Foreign Application Priority Data

Nov. 7, 2022 (GR) .............................. 20220100909

(51) Int. Cl.
*H10N 50/80* (2023.01)
*H10B 61/00* (2023.01)
(Continued)

(52) U.S. Cl.
CPC ............. *H10N 50/80* (2023.02); *H10B 61/00* (2023.02); *H10N 50/01* (2023.02); *H10N 50/20* (2023.02); *H10N 50/85* (2023.02)

(58) Field of Classification Search
CPC ........ H10N 50/80; H10N 50/01; H10N 50/85; H10N 50/10; H10B 61/22
See application file for complete search history.

(56) References Cited

U.S. PATENT DOCUMENTS 9,166,152 B2 10/2015 Chan
9,306,155 B2 4/2016 Tang
(Continued)

FOREIGN PATENT DOCUMENTS

CN 117998970 A 5/2024
DE 102015103968 A1 9/2015
(Continued)

OTHER PUBLICATIONS

European Search Report for Application No. 23196222.6, Mailing Date of Report: Feb. 28, 2024, 7 pages.
(Continued)

*Primary Examiner* — Yara B Green
*Assistant Examiner* — Erika H Son
(74) *Attorney, Agent, or Firm* — Amin, Turocy & Watson, LLP

(57) ABSTRACT

A magnetic random access memory (MRAM) stack, a method of fabricating a MRAM stack, a MRAM array, a computer system, and an MRAM device. The MRAM stack includes a first magnetic layer including a Heusler compound. The MRAM stack also includes one or more seed layers including a multi-layer templating structure that includes a crystalline structure configured to template the Heusler compound and enhance a tunnel magnetoresistance (TMR) of the MRAM stack. The first magnetic layer is
(Continued)

100 formed over the multi-layer templating structure. The multi-layer templating structure includes a layer of a first binary alloy including tungsten-aluminum (WAl), and a layer of a second binary alloy having a cesium-chloride (CsCl) structure. The second binary alloy overlays the first binary alloy.

25 Claims, 6 Drawing Sheets

(51) Int. Cl.

| | |
|---|---|
| ***H10N 50/01*** | (2023.01) |
| ***H10N 50/20*** | (2023.01) |
| ***H10N 50/85*** | (2023.01) |

(56) References Cited

U.S. PATENT DOCUMENTS

| | | | | |
|---|---|---|---|---|
| 9,559,296 | B2 | 1/2017 | Erickson | |
| 10,170,696 | B1 | 1/2019 | Jeong | |
| 10,177,308 | B2 | 1/2019 | Yang | |
| 10,395,709 | B2 | 8/2019 | Shimizu | |
| 10,396,123 | B2 | 8/2019 | Jeong | |
| 10,580,964 | B2 | 3/2020 | Park | |
| 10,629,796 | B2 | 4/2020 | Maekawa | |
| 10,651,234 | B2 | 5/2020 | Jeong | |
| 10,854,254 | B2 | 12/2020 | Park | |
| 10,867,625 | B1 | 12/2020 | Freitag | |
| 10,937,953 | B2 | 3/2021 | Jeong | |
| 10,957,848 | B2 | 3/2021 | Filippou | |
| 10,964,885 | B2 | 3/2021 | Sasaki | |
| 11,005,029 | B2 | 5/2021 | Jeong | |
| 2013/0119495 | A1* | 5/2013 | Vetr | H10B 61/22<br>257/E29.323 |
| 2020/0105999 | A1* | 4/2020 | Jeong | H10N 50/01 |
| 2020/0303634 | A1* | 9/2020 | Inubushi | H01F 10/325 |
| 2020/0403149 | A1 | 12/2020 | Guisan | |
| 2021/0273155 | A1 | 9/2021 | Gottwald | |
| 2022/0165938 | A1 | 5/2022 | Jeong | |

FOREIGN PATENT DOCUMENTS

| | | | |
|---|---|---|---|
| JP | 5534766 | B2 | 7/2014 |
| WO | 2016148391 | W | 9/2016 |
| WO | 2016148394 | A1 | 9/2016 |

OTHER PUBLICATIONS

Filippou et al., "Chiral domain wall motion in unit-cell thick perpendicularly magnetized Heusler films prepared by chemical templating", Article, Nature Communications, Nov. 7, 2018, 10 pages.

Filippou, P. et al: "Supplementary Information for Chiral domain wall motion in unit-cell thick perpendicularly magnetized Heusler films prepared by chemical templating", Nature Communications, vol. 9, Nov. 7, 2018 (Nov. 7, 2018), XP093129235.* table 1 *.

Ruiz-Calaforra, A., et al., "Magneto-Optical Characterization of Single Crystalline Co2FeAl0.4Si0.6 Thin Films on MgO (100) Substrates with Cr and MgO Seed Layers," Journal of Physics D, Applied Physics 46 (2013), 5 pages.

* cited by examiner

SEED LAYER FOR ENHANCING TUNNEL MAGNETORESISTANCE WITH PERPENDICULARLY MAGNETIZED HEUSLER FILMS

BACKGROUND

The present disclosure relates to magnetic random access memory (MRAM) devices, and, more specifically, toward enhancing the tunnel magnetoresistance (TMR) of a magnetic tunneling junction (MTJ) device with a Heusler layer in a MRAM stack.

Many known magnetic memory devices, for example, magnetic random access memory (MRAM) devices, are storage elements that store information utilizing magnetic materials as the information storage medium. At least some of these known MRAM devices are configured as a layered stack, where at least a portion of the stack is fabricated through known deposition and templating methods. Many of these known MRAM devices include a magnetic tunneling junction (MTJ) that is typically a structure that includes three distinct layers, i.e., a magnetic reference layer and a magnetic free layer (sometimes referred to as a "storage layer") with an insulating tunneling barrier therebetween. When electric current is transmitted through the MRAM device, the resistance of the MTJ typically depends on the relative orientation of magnetization of the two magnetic layers, and the relative change in resistance is referred to as the tunnel magnetoresistance (TMR). In general, a higher TMR is preferred over a lower TMR for most applications.

The direction of the current flow through the stack is typically reversible. Specifically, the electrical conductivity features of the stack above and below the MTJ are used to drive current through the MTJ in a current-perpendicular-to-plane (CPP) direction. It is advantageous for such MTJs to have magnetic layers with perpendicular magnetic anisotropy (PMA) as smaller switching currents are required as compared to in-plane magnetized MTJs. In at least some known MTJs, the free layer is formed from a Heusler compound (or alloy). Such Heusler compounds are magnetic intermetallic substances that have a tetragonal crystal configuration such that they may exhibit a relatively large volume PMA, and a low magnetic moment that requires lower switching currents.

SUMMARY

A system and method are provided for enhancing the tunnel magnetoresistance (TMR) a magnetic tunneling junction (MTJ) device with a Heusler layer in a magnetic random access memory (MRAM) stack.

In one aspect, a magnetic random access memory (MRAM) stack is presented. The MRAM device includes a first magnetic layer including a Heusler compound. The MRAM stack also includes one or more seed layers that include a multi-layer templating structure including a crystalline structure configured to template the Heusler compound and enhance a tunnel magnetoresistance (TMR) of the MRAM stack. The first magnetic layer is formed over the multi-layer templating structure. The multi-layer templating structure includes a layer of a first binary alloy including tungsten-aluminum (WAl), and a layer of a second binary alloy having a cesium-chloride (CsCl) structure. The second binary alloy overlays the first binary alloy. The desired increases in TMR are at least partially due to the enhancements to the spin polarization of the Heusler compound through improvement of the chemical ordering and/or crystallinity of the Heusler compound.

In another aspect, a method of fabricating a magnetic random access memory (MRAM) stack is presented. The method includes forming one or more seed layers that includes forming a multi-layer templating structure above a substrate. The multi-layer templating structure includes a crystalline structure configured to enhance a tunnel magnetoresistance (TMR) of the MRAM stack. The forming the multi-layer templating structure includes forming a layer of a first binary alloy including tungsten-aluminum (WAl), and forming a layer of a second binary alloy having a cesium-chloride (CsCl) structure. The second binary alloy overlays the first binary alloy. The method also includes forming a first magnetic layer including templating a Heusler compound through the multi-layer templating structure. The desired increases in TMR are at least partially due to the enhancements to the spin polarization of the Heusler compound through improvement of the chemical ordering and/or crystallinity of the Heusler compound.

In yet another aspect, a magnetic random-access memory (MRAM) array is presented. The MRAM array includes a plurality of bit lines and a plurality of corresponding complementary bit lines forming a plurality of bit line-complementary bit line pairs. The MRAM array also includes a plurality of word lines intersecting the plurality of bit line pairs at a plurality of cell locations. The MRAM array further includes a plurality of MRAM cells located at each cell location of the plurality of cell locations. Each MRAM cell of the plurality of MRAM cells is electrically connected to a corresponding bit line of the plurality of bit lines and selectively interconnected to a corresponding one of the plurality of the complementary bit lines under control of a corresponding one of the word lines of the plurality of word lines. Each MRAM cell of the plurality of MRAM cells includes a first magnetic layer including a Heusler compound. Each MRAM cell also includes one or more seed layers including a multi-layer templating structure including a crystalline structure configured to template the Heusler compound and enhance a tunnel magnetoresistance (TMR) of each MRAM cell of the plurality of MRAM cells. The first magnetic layer is formed over the multi-layer templating structure. The multi-layer templating structure includes a layer of a first binary alloy including tungsten-aluminum (WAl), and a layer of a second binary alloy having a cesium-chloride (CsCl) structure. The second binary alloy overlays the first binary alloy. The desired increases in TMR are at least partially due to the enhancements to the spin polarization of the Heusler compound through improvement of the chemical ordering and/or crystallinity of the Heusler compound.

In yet another aspect, a computer system is presented. The computer system includes one or more processing devices, and one or more memory devices communicatively and operably coupled to the one or more processing devices. At least one memory device of the one or more memory devices includes one or more magnetic random access memory (MRAM) devices. Each MRAM device of the one or more MRAM devices includes a first magnetic layer including a Heusler compound. Each MRAM device also includes one or more seed layers including a multi-layer templating structure including a crystalline structure configured to template the Heusler compound and enhance a tunnel magnetoresistance (TMR) of each MRAM device of the plurality of MRAM devices. The first magnetic layer is formed over the templating structure. The multi-layer templating structure includes a layer of a first binary alloy including tungsten-aluminum (WAl), and a layer of a second binary alloy having a cesium-chloride (CsCl) structure. The second binary alloy overlays the first binary alloy. The desired increases in TMR are at least partially due to the enhancements to the spin polarization of Heusler compound through improvement of the chemical ordering and/or crystallinity of the Heusler compound.

In yet another aspect, a magnetic random-access memory (MRAM) device is presented. The MRAM device includes a plurality of MRAM stacks. Each MRAM stack of the plurality of MRAM stacks includes a first magnetic layer including a Heusler compound. Each MRAM stack also includes one or more seed layers including a multi-layer templating structure including a crystalline structure configured to template the Heusler compound and enhance a tunnel magnetoresistance (TMR) of each MRAM stack of the plurality of MRAM stacks. The first magnetic layer is formed over the multi-layer templating structure. The multi-layer templating structure includes a layer of a first binary alloy including tungsten-aluminum (WAl), and a layer of a second binary alloy having a cesium-chloride (CsCl) structure. The second binary alloy overlays the first binary alloy. The desired increases in TMR are at least partially due to the enhancements to the spin polarization of Heusler compound through improvement of the chemical ordering and/or crystallinity of the Heusler compound.

The present Summary is not intended to illustrate each aspect of every implementation of, and/or every embodiment of the present disclosure. These and other features and advantages will become apparent from the following detailed description of the present embodiment(s), taken in conjunction with the accompanying drawings.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are illustrative of certain embodiments and do not limit the disclosure.

Figure 1:
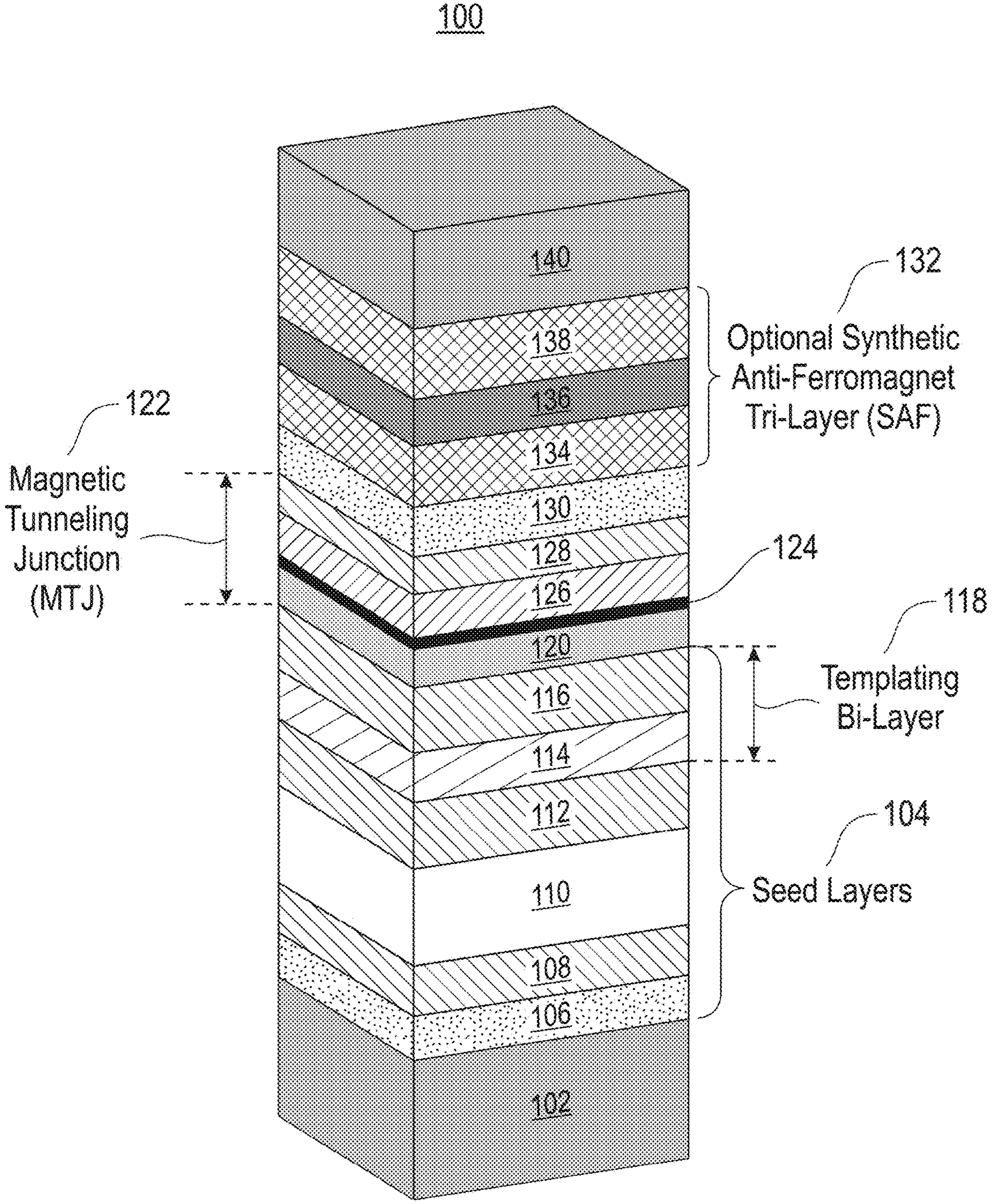
FIG. 1 is a block schematic diagram illustrating a magnetic random access memory (MRAM) stack, in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

Aspects of the present disclosure relate to enhancing the tunnel magnetoresistance (TMR) of a Heusler layer in a MRAM stack. While the present disclosure is not necessarily limited to such applications, various aspects of the disclosure may be appreciated through a discussion of various examples using this context.

It will be readily understood that the components of the present embodiments, as generally described and illustrated in the Figures herein, may be arranged and designed in a wide variety of different configurations. Thus, the following details description of the embodiments of the apparatus, system, method, and computer program product of the present embodiments, as presented in the Figures, is not intended to limit the scope of the embodiments, as claimed, but is merely representative of selected embodiments.

Reference throughout this specification to "a select embodiment," "at least one embodiment," "one embodiment," "another embodiment," "other embodiments," or "an embodiment" and similar language means that a particular feature, structure, or characteristic described in connection with the embodiment is included in at least one embodiment. Thus, appearances of the phrases "a select embodiment," "at least one embodiment," "in one embodiment," "another embodiment," "other embodiments," or "an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

As used herein, "facilitating" an action includes performing the action, making the action easier, helping to carry the action out, or causing the action to be performed. Thus, by way of example and not limitation, instructions executing on one processor might facilitate an action carried out by semiconductor processing equipment, by sending appropriate data or commands to cause or aid the action to be performed. Where an actor facilitates an action by other than performing the action, the action is nevertheless performed by some entity or combination of entities.

Many known magnetic memory devices, for example, magnetic random access memory (MRAM) devices, are storage elements that store information utilizing magnetic materials as the information storage medium. At least some of these known MRAM devices are configured as a layered stack, where at least a portion of the stack is fabricated through known deposition and templating methods. Referencing a stack configuration, the terms "up" and "down," "lower" and "upper," and "top" and "bottom" are frequently used. Many of these known MRAM devices include a magnetic tunneling junction (MTJ) that is typically a structure that includes three distinct layers, i.e., a magnetic reference layer and a magnetic free layer (sometimes referred to as a "storage layer") with an insulating tunneling barrier therebetween. When electric current is transmitted through the MRAM device, the resistance of the MTJ depends on the magnetic orientation of the two magnetic layers, and the relative change in resistance between the parallel and anti-parallel orientations of the magnetization is referred to as the tunnel magnetoresistance (TMR), which in some cases is expressed in units of percentage change. In most applications, a higher TMR is preferred over a lower TMR.

Some MTJs employ a spin-transfer torque (STT) effect, and are also non-volatile STT-MRAM devices that have lower power consumption advantages over charge-based memory devices, such as static RAM (SRAM) and dynamic RAM (DRAM). The STT effect facilitates the toggling of magnetic orientation of the free layer of the MTJ. More specifically, the magnetic moment of the reference layer is generally fixed, or pinned, in a particular direction. The free layer has a changeable magnetic moment and is used to store information with the data state of either a “1” or a “0.” The electrons that define an electric current have the intrinsic quantum mechanics property of spin that is associated with the spin angular momentum of the electrons. The electron spin will have one of two distinct quantum states, i.e., spin-up and spin-down. In general, an electric current is unpolarized, i.e., consisting of approximately 50% spin-up electrons and approximately 50% spin-down electrons. A spin-polarized current is one with more electrons of either spin state. By passing electrons through the fixed reference layer, a spin-polarized current is produced, where the current has a spin-polarized angular momentum. When this spin-polarized current is directed into the free layer, the polarized angular momentum is transferred to the free layer, thereby applying a torque to the free layer and changing, i.e., flipping (toggling or switching) the orientation of the respective magnetic field. Flipping the orientation of the magnetic field will flip the data state of the free layer. As described further herein, this description explains the change in magnetization of the free layer when it is anti-parallel to the reference layer, and to change the magnetization from the parallel to anti-parallel state, the direction of the electron flow is reversed.

The TMR is related to the spin polarization, i.e., typically high spin polarization leads to high TMR. High spin polarization, and thus high TMR, is desirable, since the higher TMR provides a higher ON/OFF ratio. The direction of the current flow through the stack is typically reversible. Specifically, the electrical conductivity features of the stack above and below the MTJ are used to drive current through the MTJ in a current-perpendicular-to-plane (CPP) direction. Therefore, it is advantageous for such MTJs, and more specifically, the magnetic layers, to have perpendicular magnetic anisotropy (PMA) as smaller switching currents are required as compared to in-plane magnetized MTJs. As such, for MTJs for MRAM applications, it is desirable that substantially all the magnetic elements have their moments perpendicular to the layer itself, i.e., magnetization perpendicular to the film plane and the PMA arising from the crystalline structure, with the magnetic moments of the magnetic layer perpendicular to the layer. For example, in the case of MTJs with a positive tunnel magnetoresistance (TMR), i.e., when a sufficient current is driven in a top-to-bottom CPP direction, where the free layer is above the tunnel barrier with the reference layer below the tunnel barrier, and, by convention, the current direction is opposite to the electron flow direction and the initial state of the MTJ device is anti-parallel state, the free layer magnetic moment switches to be parallel to that of the reference layer, thereby defining a low resistance to current flow within the MTJ device. In the parallel configuration, the two magnetic layers have their magnetizations aligned with each other, and the resistance is typically lower in this state relative to the anti-parallel configuration, discussed as follows.

When a sufficient current is driven in the opposite direction (e.g., bottom to top), the free layer magnetic moment switches to be anti-parallel to that of the reference layer, thereby defining a high resistance to current flow within the MTJ device. In the anti-parallel state, the magnetic layers do not have their magnetizations aligned with each other, and the resistance is typically higher in this state relative to the parallel configuration. Therefore, the magnetic state of the MTJ is changed by passing an electric current through it. The current delivers spin angular momentum, so that once a threshold current is exceeded, the direction of the memory layer moment is switched. Accordingly, different current directions define different spin-polarized currents to generate different magnetic configurations corresponding to different magnetoresistance states and thus different logical states, e.g., a logical “0” and a logical “1” of the MTJ.

In at least some known MTJs, the free layer is formed from a Heusler compound (or alloy). Reference herein to Heusler or Heuslers without the term “half” is intended to reference full-Heuslers. Some Heusler compounds are magnetic intermetallic substances and a subset of these have a tetragonal configuration, a relatively large volume PMA, and a low magnetic moment that requires lower switching currents. One such Heusler compound is manganese-germanium ($Mn_3Ge$). One known method of inducing PMA in a magnetic Heusler compound includes modifying the compound from an originally cubic crystalline configuration to a tetragonal crystalline configuration. Therefore, instead of having all three unit cell lattice parameters to be of the same length, if one of the lattice parameters is a little longer (or shorter), then, because of breaking of the crystal symmetry, the magnetization can be tuned to be perpendicular.

In the tetragonal case, for example, where some Heusler compounds have a tetragonal ground state (e.g., $Mn_3Ge$), the compound shows PMA if the tetragonal axis of the compound is along the Z-axis, i.e., perpendicular to the film plane, where an out-of-plane lattice parameter is longer (or shorter) than the in-plane lattice parameters. In addition, it may be desirable that magnetic materials have volume PMA rather than surface (interfacial) PMA, as this enables scaling of devices to smaller sizes (typically smaller diameter). As device size is reduced, the devices become less thermally stable. However, for devices with volume anisotropy, it is advantageously possible to compensate for the lowering of thermal stability by increasing the thickness. The switching current is proportional to the product ($M_s$*V*$H_k$), where $M_s$ is saturation magnetization, V is volume, and $H_k$ is the anisotropy field. Low moment (i.e., low $M_s$) Heusler compounds need lower switching currents, unless the increase in $H_k$ overwhelms the lower $M_s$. In the tetragonal case, the Z (vertical) axis is “stretched” (shrinking is also possible in alternative approaches) relative to the cubic case. Because of the bulk anisotropy, the magnetization tends to be perpendicular to the film (i.e., along the Z axis). If the Heusler layer is grown with a Z-axis perpendicular to the (x-y) plane of the film, on a suitable templating layer, the Heusler layer will have a moment which is perpendicular to the (x-y) plane of the film. Accordingly, the tetragonality and the associated PMA facilitates suitability for use in perpendicular MTJs.

One additional known method of enhancing the TMR of the Heusler compounds include using templating materials, such as materials with a CsCl-like (cesium-chloride-like) structure, i.e., a crystalline structure that defines a substantially continuous lattice with each cubical unit including a cesium atom surrounded by 8 chlorine atoms, i.e., one Cl atom at each corner of the cube, to further define a body-centered cubic (BCC) unit cell structure. The CsCl-like templating materials grown with (001) orientation have alternating layers of Cs and Cl. Two examples of such CsCl-like chemical templating layers (CTL) includes cobalt-aluminum (CoAl) and iridium-aluminum (IrAl) alloys, or together defining bi-layer templating materials. The templating materials may include a single layer structure and a multi-layered structure.

During fabrication of MRAM stacks, i.e., deposition and patterning of the various layers of the MRAM stacks (or pillars), a thin layer of a material coating may form on the outside wall of the pillar. This coating may provide an external conduction path that may shunt the tunnel barrier (e.g., the MgO layer as discussed further herein) is often removed through methods that include etching. However, depending on the materials used in the pillar, etching may not always be an option to effectively remove the coating. Therefore, in some instances, oxidizing the external coating to make the coating insulating is an option. However, Ir does not always oxidize well in these circumstances. Accordingly, a substitute for the IrAl layer is desired.

As described above, high TMR is desirable since the higher TMR provides a higher ON/OFF ratio and a resultant higher signal-to-noise ratio for determination of the MTJ device state. Therefore, there is a need to implement further upward improvements of the TMR of the Heusler compounds to enhance the performance of the MTJs to further reduce the power consumption of the MRAM devices. Accordingly, fabrication enhancements to the memory stacks to overcome the technical limitations present in the state-of-the-art memory stack fabrication processes to enhance the polarization of the electron spin is desirable.

Some known methods of enhancing uniaxial anisotropy in the full-Heusler compound $Co_2FeAl_{0.4}Si_{0.6}$ (CFAS) includes using various combinations of magnesium-oxide (MgO) and chromium (Cr) as seed layers (see the non-patent literature (NPL) titled "Magneto-optical characterization of single crystalline $Co_2FeAl_{0.4}Si_{0.6}$ thin films on MgO(100) substrates with Cr and MgO" authored by Ruiz-Calaforra et al.). In addition, some known methods of enhancing the thermoelectric conversion properties of Heusler alloys, such as $Fe_2VAl$, through an MgO substrate and a laminate with placement of a metal layer in between layers of zirconium oxide/yttrium oxide and MgO (see U.S. Ser. No. 10/629,796). However, in both cases, the aforementioned Heusler compounds have a cubic structure and the magnetization thereof is parallel to the Heusler film, in contrast to the desired perpendicular magnetic anisotropy (PMA). Also, in some instances, the parallel magnetic anisotropy may be controlled (see U.S. Ser. No. 10/395,709).

Some known methods of forming optional seed layers in non-Heusler devices include single layer structures or may comprise two, three, four, or more sublayers formed adjacent to each other. One or more of the single layer and the multiple sublayers of the seed layer comprise one or more of the following elements: B, Mg, Ti, Zr, Hf, V, Nb, Ta, Cr, Mo, W, Mn, Re, Fe, Ru, Os, Co, Rh, Ir, Ni, Pd, Pt, Cu, Ag, Au, Al, Si, Ge, Ga, O, N, and C. For example, the seed layer 192 may include a layer of MgO, Ta, Hf, W, Mo, Ru, Pt, Pd, NiCr, NiTa, NiTi, or $TaN_x$. Alternatively, the seed layer 192 may include a bilayer structure (Ru/Ta) comprising a Ta sublayer formed adjacent to one of the magnetic layers and a Ru sublayer formed beneath the Ta sublayer. Other exemplary bilayer structures (bottom/top), such as Ta/Ru, Ta/Hf, Hf/Ta, Ta/W, W/Ta, W/Hf, Hf/W, Mo/Ta, Ta/Mo, Mo/Hf, Hf/Mo, Ru/W, W/Ru, MgO/Ta, Ta/MgO, Ru/MgO, Hf/MgO, and W/MgO, may also be used for the seed layer. Still alternatively, the seed layer may include a bilayer structure comprising an oxide sublayer, such as MgO, formed adjacent to one of the magnetic layers and an underlying, thin conductive sublayer, such as CoFeB which may be non-magnetic or amorphous or both. Additional seed sublayers may further form beneath the exemplary CoFeB/MgO seed layer to form other seed layer structures, such as but not limited to Ru/CoFeB/MgO, Ta/CoFeB/MgO, W/CoFeB/MgO, Hf/CoFeB/MgO, Ta/Ru/CoFeB/MgO, Ru/Ta/CoFeB/MgO, W/Ta/CoFeB/MgO, Ta/W/CoFeB/MgO, W/Ru/CoFeB/MgO, Ru/W/CoFeB/MgO, Hf/Ta/CoFeB/MgO, Ta/Hf/CoFeB/MgO, W/Hf/CoFeB/MgO, Hf/W/CoFeB/MgO, Hf/Ru/CoFeB/MgO, Ru/Hf/CoFeB/MgO, Ta/W/Ru/CoFeB/MgO, Ta/Ru/W/CoFeB/MgO, and Ru/Ta/Ru/CoFeB/MgO. Still alternatively, the seed layer may include a multilayer structure formed by interleaving seed sublayers of a first type with seed sublayers of a second type. One or both types of the seed sublayers may comprise one or more ferromagnetic elements, such as Co, Fe, and Ni. For example, the seed layer may be formed by interleaving layers of Ni with layers of a transition metal, such as but not limited to Ti, Zr, Hf, V, Nb, Ta, Cr, Mo, W, or any combination thereof. One or both types of seed sublayers may be amorphous or non-crystalline. For example, the first and second types of sublayers may respectively be made of Ta and CoFeB, both of which may be amorphous (see U.S. Ser. No. 10/177,308).

Some known methods of manufacturing a STT-MRAM device with a MTJ include placing a layer of tantalum (Ta) below a cobalt/nickel $[CoNi]_x$ layer for obtaining a perpendicular magnetic anisotropy and using high pressure argon to prevent damage to the interface between the Co and Ni (see JP5534766B2). Yet another known method of manufacturing a STT-MRAM device with a MTJ for obtaining a perpendicular magnetic anisotropy with a free layer includes forming a stack with a sequence of materials that includes a substrate, a lower electrode, a first buffer layer, a seed layer, a composite exchangeable ferromagnetic layer, a capping layer, a pinned layer, a tunnel barrier, a free layer, a second buffer layer, and an upper electrode. The seed layer may be formed of tantalum (Ta), ruthenium (Ru), titanium (Ti), palladium (Pd), platinum (Pt), magnesium (Mg), cobalt (Co), or an alloy thereof. Preferably, the seed layer 130 may be formed of platinum (Pt), and may be formed to a thickness of 1 nm to 3 nm (see WO2016148394A1).

Yet another known method of manufacturing a STT-MRAM device with a MTJ for obtaining a perpendicular magnetic anisotropy with a free layer includes forming a stack with a sequence of materials that includes a substrate, a lower electrode, a buffer layer, a seed layer, a free layer, a tunnel barrier, a pinned layer, a capping layer, a composite exchangeable magnetic layer, and an upper electrode, where the free layer, the tunnel barrier, and the pinned layer form a magnetic tunnel junction. The seed layer may be formed of at least two layers, for example, a laminate structure of the first seed layer and the second seed layer. The first and second seed layers may be formed of a polycrystalline material. In addition, the first seed layer is formed of a material capable of self-crystallization at bcc (body center cubic), and the second seed layer is formed of a material having a bcc structure. For example, the first seed layer may be formed of magnesium oxide (MgO), aluminum oxide ($Al_2O_3$), silicon oxide ($SiO_2$), tantalum oxide ($Ta_2O_5$), silicon nitride ($SiN_x$) and may be preferably formed of magnesium oxide. In addition, the second seed layer 134 may be formed of, for example, tungsten (W) (see WO2016148391A1).

A known spin transfer torque (STT) device has a free ferromagnetic layer that includes a Heusler alloy layer and a template layer beneath and in contact with the Heusler alloy layer. The template layer may be a ferromagnetic alloy comprising one or more of Co, Ni and Fe and the element X, where X is selected from one or more of Ta, B, Hf, Zr, W, Nb and Mo. A CoFe nanolayer may be formed below and in contact with the template layer. The STT device may also be a STT in-plane or perpendicular magnetic tunnel junction (MTJ) cell for magnetic random access memory (MRAM) (see U.S. Ser. No. 10/867,625).

Referring to FIG. 1, a block schematic diagram is presented illustrating a spin-transfer torque (STT) switchable magnetic random access memory (MRAM) stack 100 (referred to as the MRAM stack 100 herein), in accordance with some embodiments of the present disclosure. For purposes of clarity, the components illustrated in FIG. 1 are not drawn to scale. In some embodiments, the MRAM stack 100 is approximately 100 nanometers (nm) in height, where, in general, the height is a non-limiting factor with respect to performance thereof, and, therefore, the MRAM stack 100 has any height that enables operation as described herein. As used herein, "in-plane" is substantially within or parallel to the plane of one or more of the layers of a magnetic tunnel junction. Conversely, "perpendicular" and "perpendicular-to-plane" corresponds to a direction that is substantially orthogonal to one or more of the layers of the magnetic tunnel junction. The method and system are also described in the context of certain alloys. However, unless otherwise specified, these listings of alloys are non-limiting, and if specific concentrations of the alloy are not mentioned, any stoichiometry that enables operation of the embodiments of the MRAM stack 100 as described herein that is not inconsistent with such embodiments may be used.

Figure 2:
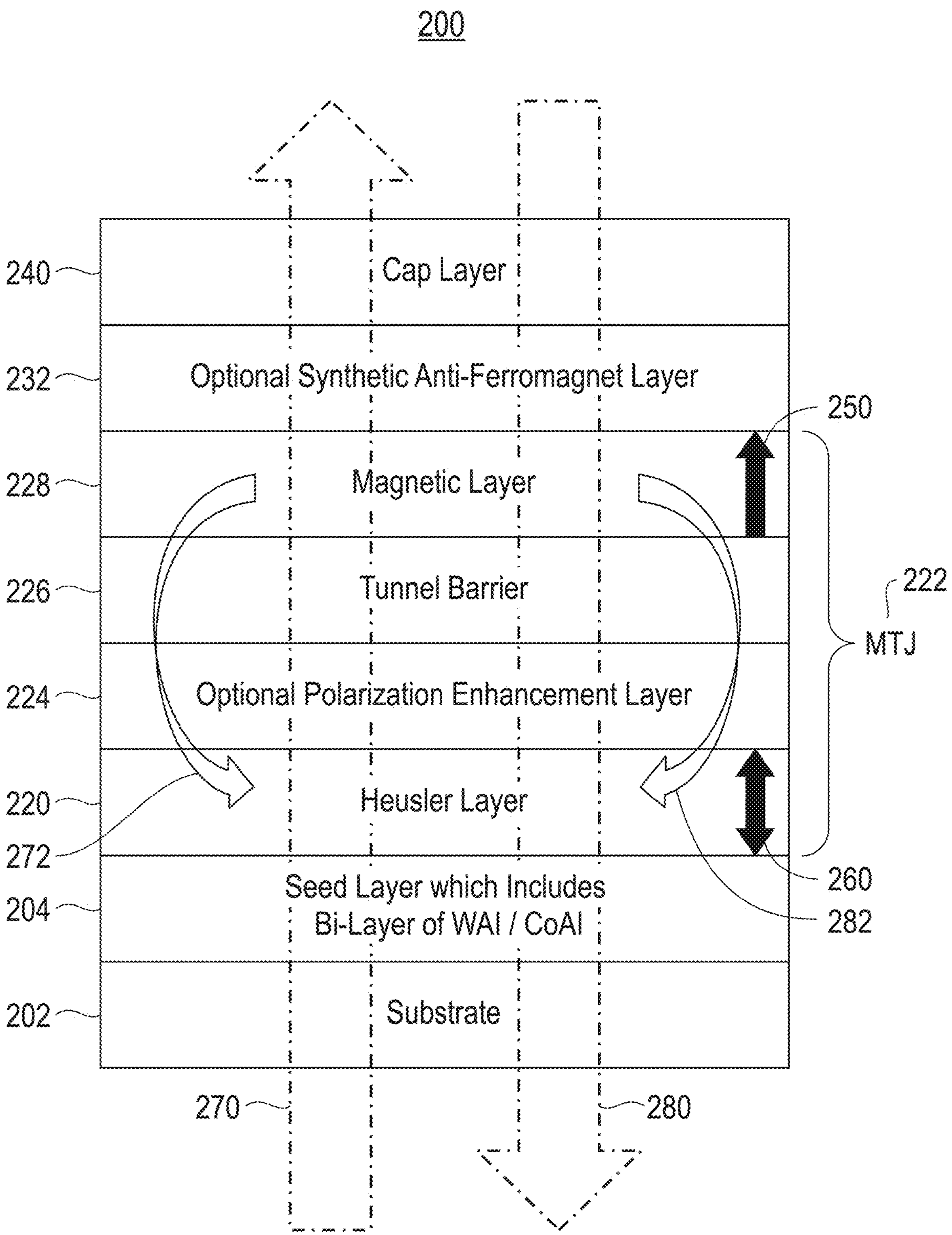
FIG. 2 is a simplified block schematic diagram illustrating portions of the MRAM stack of FIG. 1 and the respective magnetic moments, in accordance with some embodiments of the present disclosure.

Also referring to FIG. 2, a simplified block schematic diagram is presented illustrating portions of the MRAM stack 200 (shown as the MRAM stack 100 in FIG. 1) and the respective magnetic moments, in accordance with some embodiments of the present disclosure. Similar components in both FIG. 1 and FIG. 2 have similar numbering.

In one or more embodiments, the MRAM stack 100 includes a silicon-based substrate layer 102 (shown as "Substrate 202" in FIG. 2) that is typically held at approximately room temperature, i.e., at approximately 20 degrees Celsius (° C.) to approximately 25° C. The substrate layer 102 is configured to provide the proper electrical conductivity for the MRAM stack 100 as described further herein. In some embodiments, the substrate layer 102 includes one or more of silicon oxide ($SiO_2$), tantalum (Ta), and ruthenium (Ru). In some embodiments, the Si/$SiO_2$ portion (not shown) of the substrate layer 102 has any thickness, the Ta portion (not shown) of the substrate layer 102 is approximately 50 angstroms (Å) in thickness, and the Ru portion (not shown) of the substrate layer 102 is approximately 250 Å in thickness, where the thicknesses are presented in the vertical direction in FIG. 1. In some embodiments, the thicknesses of the Si, $SiO_2$, Ta, and Ru portions of the substrate layer 102 are any values that enable operation of the MRAM stack 100 as described herein.

In at least some embodiments, the MRAM stack 100 includes a plurality of seed (chemical templating) layers 104 (shown as 204 in FIG. 2), at least some that are deposited at approximately room temperature. In some embodiments, the seed layers 104 include a lower Ta layer 106 with a thickness of approximately 50 Å to approximately 100 Å that is formed to extend over the substrate layer 102, and with a thickness to extend in the vertical direction. In some embodiments, the lower Ta layer 106 is not a portion of the seed layers 104. In addition, in some embodiments, the MRAM stack 100 includes a lower amorphous cobalt-iron-boron alloy (CoFeB) layer 108 formed to extend over the lower Ta layer 106, and with a thickness to extend in the vertical direction, at approximately room temperature. In at least some embodiments, the CoFeB layer 108 is structured such that approximately 80% of the atoms in the compound are a CoFe alloy and approximately 20% of the atoms are boron, and is herein referred to as $(CoFe_{80}B_{20}$. The boron (B) content of the lower $(CoFe)_{80}B_{20}$ 108 layer is not restricted to approximately 20% but can be varied and is typically in the range from approximately 15% to approximately 35%. This $(CoFe)_{80}B_{20}$ layer 108 is non-magnetic, at least partially as a consequence of it being ultra-thin. In some embodiments, the lower $(CoFe)_{80}B_{20}$ layer 108 has a thickness of approximately 5 Å. In some embodiments, the lower $(CoFe)_{80}B_{20}$ layer 108 is not a portion of the seed layers 104. In some embodiments, other known amorphous materials are substituted for the lower $(CoFe)_{80}B_{20}$ layer 108.

Further, in at least some embodiments, the seed layers 104 include a manganese nitride ($Mn_xN$) layer 110 that is formed to extend over the lower $(CoFe)_{80}B_{20}$ layer 108, and with a thickness to extend in the vertical direction, at approximately room temperature. In some embodiments, x (the number of Mn atoms) generally has a value within a range of approximately 2 to approximately 4.5. In some embodiments, x generally has a value of at least 2 and not more than 4.0. In some embodiments, the $Mn_xN$ is deposited by reactive sputtering from a Mn target with a sputter gas containing an Ar—$N_2$ mixture with the Ar-to-$N_2$ ratio of approximately 85:15. In some embodiments, the $Mn_xN$ layer 110 has a thickness of approximately 50 Å to approximately 300 Å. In some embodiments the $Mn_xN$ layer 110 is formed with the desired Miller indices directional value of (001) for the orientation, i.e., the planes of the atoms in the crystalline structure are oriented to form successive layers of atoms that sequentially extend in the vertical direction (see FIG. 1).

The $Mn_xN$ layer 110 facilitates forming, i.e. depositing, a CsCl-like chemical templating layer (CTL), or more specifically, a binary alloy with CsCl structure as represented by $A_{1-x}E_x$, where A is a transition metal element and E is a main group element. In some embodiments, A is cobalt (Co) and E includes at least one other element that includes aluminum (Al), with x being in a range from 0.45 to 0.55. Therefore, at least one strongly-textured crystalline cobalt-aluminum (CoAl) layer (two are shown in FIG. 1, i.e., a first CoAl layer 112 and a second CoAl layer 116), as discussed further herein, above the $Mn_xN$ layer 110, thereby defining a (001) texture of the CoAl. The amorphous lower $(CoFe)_{80}B_{20}$ layer 108 facilitates breaking any texture of the underlying layers, i.e., the $Mn_xN$ layer 110 grows over the $(CoFe)_{80}B_{20}$ layer 108 with the (001) orientation, thereby facilitating directional and texture values of (001) in the layers above the $Mn_xN$ layer 110. While it is important that the $(CoFe)_{80}B_{20}$ be amorphous, the composition of the $(CoFe)_{80}B_{20}$ is not critical, i.e., the Co-to-Fe ratio is not restricted to any particular range of values. Moreover, the B content of this amorphous CoFeB alloy may be varied. Accordingly, the $Mn_xN$ layer 110 is employed for promoting ordered growth of the first and second CoAl layers 112 and 116, respectively, and other layers above, where both of the ordered CoAl layers 112 and 116 have alternating planes of cobalt atoms and aluminum atoms.

In one or more embodiments, the seed layers 104 include the CoAl layer 112 that is formed to extend over $Mn_xN$ layer 110, and with a thickness to extend in the vertical direction, and deposited at approximately room temperature. In some embodiments, the thickness of the CoAl layer 112 is within a range between approximately 20 Å to approximately 300, and in some embodiments, has a thickness of approximately 150 Å.

In at least some embodiments, a tungsten-aluminum (WAl) layer 114 is formed to extend over the first CoAl layer 112, and with a thickness to extend in the vertical direction, where the WAl layer 114 also has a crystalline structure, and is deposited at approximately room temperature. In some embodiments, the WAl layer 114 is formed through co-sputtering of the W and Al targets to attain the desired composition of the WAl layer 114. In some embodiments, the composition of the WAl layer 114 is $W_{1-x}A_x$, with x being in a range from approximately 0.40 to approximately 0.60. In some embodiments, the thickness of the WAl layer 114 is in the range from approximately 50 Å to 300 Å, and in some embodiments, has a thickness of approximately 100 Å. The second CoAl layer 116 is formed to extend over the WAl layer 114, and with a thickness to extend in the vertical direction, and is deposited at approximately room temperature. In some embodiments, the thickness of the second CoAl layer 116 is within a range between approximately 10 Å to approximately 300 Å, and in some embodiments, has a thickness of approximately 150 Å. The WAl layer 114 and the second CoAl layer 116 together define a templating bi-layer 118 (discussed further herein). The templating layer is not necessarily limited to a bi-layered structure and in some embodiments is a single layer structure of CsCl-like chemical templating compounds, and in some embodiments is a multilayer structure of CsCl-like chemical templating compounds, such as, and without limitation, CoAl, CoGa, CoGe, IrAl, RuAl, and the like. As discussed further herein, the templating bi-layer 118 is employed to enhance the TMR of the MRAM stack 100. In some embodiments, a layer of chromium (Cr) is use as a substitute for the second CoAl layer 116.

In one or more embodiments, the seed layers 104 define a crystalline structure thereof that is employed to template a manganese-germanium layer, i.e., a $Mn_3Ge$ layer 120, where the $Mn_3Ge$ layer 120 is a crystalline Heusler compound (or alloy). The Heusler compound $Mn_3Ge$ is described in its stoichiometric form here; however, it is possible to vary the stoichiometry over a limited range as described for some embodiments further herein. In some embodiments, the templating is executed through epitaxially growing the $Mn_3Ge$ layer 120. The $Mn_3Ge$ layer 120 is sometimes referred to as the "Heusler layer" (shown as 220 in FIG. 2). In addition, the $Mn_3Ge$ layer 120 is sometimes referred to as the lower magnetic layer of a magnetic tunneling junction (MTJ) 122. Moreover, the $Mn_3Ge$ layer 120 is sometimes referred to as the "free layer." Furthermore, the $Mn_3Ge$ layer 120 is sometimes referred to as the "storage layer." Furthermore, the $Mn_3Ge$ layer 120 is sometimes referred to as the "switchable magnetic layer."

In general, the $Mn_3Ge$ layer 120 is a magnetic intermetallic substance that has a tetragonal crystal configuration, a relatively large volume perpendicular magnetic anisotropy (PMA), and a low magnetic moment (not shown in FIG. 1) that requires lower switching currents. The $Mn_3Ge$ layer 120 is configured to drive current through the MTJ 122 in a current-perpendicular-to-plane (CPP) direction. In some embodiments, the thickness of the $Mn_3Ge$ layer 120 is less than approximately 5 nanometers (nm), i.e., less than approximately 50 Å. In some embodiments, the thickness of the $Mn_3Ge$ layer 120 is at least approximately 1 nm thick, i.e., approximately 10 Å. In some embodiments, the thickness of the $Mn_3Ge$ layer 120 is within a range of approximately 13 Å and approximately 21 Å. In some embodiments, the Heusler layer 120 may be a multilayer object that includes one or more Heusler compounds and/or other materials. In some embodiments, the $Mn_3Ge$ layer 120 is templated at approximately room temperature by the templating layer which may include the bi-layer 118 and then subsequently annealed at temperatures within the range between approximately 100° C. to approximately 400° C., and in some embodiments, at approximately 340° C.

While the one embodiment described above includes the use of $Mn_3Ge$ as the selected Heusler compound, there are a number of alternative Heusler compounds as well. In general, tetragonal Heusler compounds include $Mn_3Z$, where Z=germanium (Ge), tin (Sn), and antimony (Sb), since they all have the relatively large volume PMA, and have a low magnetic moment. In some embodiments the composition is selected from $Mn_{3.3-x}Ge$, $Mn_{3.3-x}Sn$, and $Mn_{3.3-x}Sb$, with x being in a range from 0 to not more than 1.1. In some embodiments, the Heusler compound is a ternary Heusler compound, e.g., selected from the manganese-cobalt-tin group including one of $Mn_{3.3-x}Co_{1.1-y}Sn$, in which x≤1.2 and y≤1.0. Moreover, in some embodiments, the Heusler compound is chosen from $Mn_3Al$, $Mn_3Ga$, $Mn_3In$, $Mn_2FeSb$, $Mn_3CoAl$, $Mn_2CoGe$, $Mn_2CoSi$, $Mn_2CuSi$, $Mn_2CoSn$, $Co_2CrAl$, $Co_2CrSi$, $Co_2MnSb$, and $Co_2MnSi$. Further discussion on the use of Heusler compounds herein will be limited to $Mn_3Ge$.

The cooperation of the $Mn_xN$ layer 110, the first CoAl layer 112, the WAl layer 114, and the second CoAl layer 116 enhances the value of the TMR for the MRAM stack 100. In general, increasing the operational TMR of the MRAM stack 100 is at least partially through enhancing the spin polarization of the $Mn_3Ge$ layer 120. As described above, the $Mn_xN$ layer 110 is employed for promoting ordered growth of the first and second CoAl layers 110 and 116, respectively.

The TMR of the bulk-like $Mn_3Ge$ layer 120, with little to no engineering thereof, is limited by the compensation effect due to the structure of the Heusler material, i.e., the compensation in the tunnelling spin current polarization from atomic layer variations of the electrode surface termination at the tunnel barrier interface, where this is an inevitable consequence of ferrimagnets with layer-by-layer alternation of magnetization, and the spin polarizations of these layers compensate each other. The use of templating layers, such as the CoAl layer 116, with an in-plane lattice constant a=4.03 Å (45 degrees in-plane rotated) determines tetragonal distortion of the $Mn_3Ge$ layer 120 so that the compensation effect is no longer applicable and the TMR is higher than observed for the bulk-like $Mn_3Ge$ films. As described above, the CoAl templating layer 116 needs to have the (001) orientation and texture for inducing the requisite PMA energy in the Heusler film. Also, as described above, this (001) orientation and texture of the CoAl layer 116 is achieved by deposition of the CoAl layer 116 on the $Mn_xN$ layer 110. The TMR of the $Mn_3Ge$ layer 120 is further enhanced through the addition of the WAl layer 114, such that the combination of the CoAl layer 116 and the WAl layer 114, as the templating bi-layer 118, further enhances the TMR of the $Mn_3Ge$ layer 120.

The TMR of a substance is the ratio of the difference in the electrical resistance between the anti-parallel state and the resistance of the parallel state to the resistance in the parallel state and is typically reported as a percentage. The TMR of the $Mn_3Ge$ layer 120 is measured when the thickness of the WAl layer 114 is varied between approximately 50 Å and approximately 300 Å with the thickness of the CoAl layer 116 held constant at approximately 150 Å. Similarly, the TMR of the $Mn_3Ge$ layer 120 is measured when the thickness of the CoAl layer 116 is varied between approximately 50 Å and approximately 150 Å with the thickness of the WAl layer 114 held constant at approximately 100 Å. Notably, in some embodiments, e.g., and without limitation, an improvement of the TMR values in excess of 20%, including, in some instances, in excess of approximately 30%, have been experienced with the thickness of the WAl layer 114 within a range of approximately 50 Å to approximately 100 Å (as compared to a range of approximately 200 Å to approximately 300 Å), and the thickness of the CoAl layer 116 at approximately 150 Å for both ranges of the WAl layer 114 thickness. The improvement of the TMR associated with the $Mn_3Ge$ Layer 120 is most likely due to the increased ordering of the Heusler compound therein.

In some embodiments, the MTJ 122 includes an optional polarization enhancement layer 124 (shown as 224 in FIG. 2) that is configured to enhance the polarization of the different spin-polarized currents to further enhance the TMR of the MTJ 122. The materials of the polarization enhancement layer 124 have one or more high spin polarization features where the materials include, without limitation, one or more of Fe, CoFe, and $(CoFe_{80}B_{20}$. As shown in FIG. 1, in some embodiments, the polarization enhancement layer 124 is positioned between the $Mn_3Ge$ layer 120 and a MgO layer 126 (discussed further herein). In some embodiments, the polarization enhancement layer 124 is positioned between the MgO layer 126 an upper $(CoFe)_{80}B_{20}$ layer 128 (discussed further herein). In some embodiments, the polarization enhancement layer 124 is positioned on both sides of the MgO layer 126.

In at least some embodiments, the MTJ 122 includes the MgO layer 126, that is also referred to as the tunnel barrier 126 (shown as 226 in FIG. 2), formed from crystalline MgO. In some embodiments, the MgO layer 126 is in direct contact with the $Mn_3Ge$ layer 120 (lower magnetic layer) and the upper $(CoFe)_{80}B_{20}$ layer 128 (upper magnetic layer). Therefore, in such embodiments, the tunnel barrier is thereby positioned between, and in contact with, the first magnetic layer (i.e., the $Mn_3Ge$ layer 120, or the lower magnetic layer) and the second magnetic layer (i.e., the upper $(CoFe)_{80}B_{20}$ layer 128, or the upper magnetic layer). In some embodiments, the MgO layer 126 is separated from one of the $Mn_3Ge$ layer 120 and the upper $(CoFe_{80}B_{20}$ layer 128 through the optional polarization enhancement layer 224. The resistance of the MTJ device 122 across the MgO layer 126 is high if the magnetic moments of the $Mn_3Ge$ layer 120 and the upper $(CoFe)_{80}B_{20}$ layer 128 are anti-parallel and low if such magnetic moments are parallel. In some embodiments, the MgO layer 126 is formed to extend directly over the $Mn_3Ge$ layer 120 in the vertical direction at approximately room temperature and in some embodiments, there is an optional polarization enhancement layer 124 therebetween (as shown in FIG. 1). The thickness of the MgO layer 126 determines the RA of the MTJ device 122 and is typically in the range from approximately 10 Å to approximately 20 Å. In some embodiments, the thickness of the MgO layer 126 is approximately 12 Å.

In one or more embodiments, the tunnel barrier 126 is formed from $MgAl_2O_4$ where the lattice spacing is tuned (engineered) by controlling the Mg—Al composition to result in better lattice matching with the Heusler compounds (as listed above), e.g., and without limitation, the composition of this tunnel barrier 126 can be represented as $Mg_{1-z}Al_{2+(2/3)z}O_4$, where $-0.5<z<0.5$.

In at least some embodiments, the MTJ 122 includes the upper $(CoFe)_{80}B_{20}$ layer 128 (shown as 228 in FIG. 2) that is formed to extend over the tunnel barrier 126, and with a thickness to extend in the vertical direction, at approximately room temperature. In some embodiments, the optional polarization enhancement layer 124 is positioned between the upper $(CoFe)_{80}B_{20}$ layer 128 and the tunnel barrier 126. In some embodiments, the upper $(CoFe_{80}B_{20}$ layer 128 has a thickness in a range from approximately 12 Å to 16 Å, and in some embodiments, with a value of approximately 14 Å. In some embodiments, the upper $(CoFe_{80}B_{20}$ layer 128 is a reference layer that defines a reference layer magnetic moment (not shown in FIG. 1). The magnetic moment of the upper $(CoFe)_{80}B_{20}$ layer 128 is generally fixed, or pinned, in a particular direction perpendicular-to-plane. Moreover, in some embodiments, the upper $(CoFe)_{80}B_{20}$ layer 128 includes a bilayer of CoFeB compounds for different B content which ranges between approximately 15 to approximately 35%. Therefore, the upper $(CoFe)_{80}B_{20}$ layer 128 is sometimes referred to as the upper magnetic layer.

In some embodiments, the MRAM stack 100 includes an upper Ta layer 130 with a thickness of approximately 2.5 Å to approximately 50 Å that is formed to extend over the upper $(CoFe)_{80}B_{20}$ layer 128, and with a thickness to extend in the vertical direction, at approximately room temperature. In some embodiments, the upper $(CoFe)_{80}B_{20}$ layer 128 is annealed at approximately 350° C.

In some embodiments, the MRAM stack 100 includes an optional synthetic anti-ferromagnet (SAF) tri-layer 132 (shown as 232 in FIG. 2) positioned to extend over the upper Ta layer 130. In such embodiments, the Ta thickness is chosen to provide optimal magnetic coupling between the SAF tri-layer 132 and the upper $(CoFe)_{80}B_{20}$ layer 128. The SAF tri-layer 132 includes a lower cobalt/platinum (Co/Pt) layer 134 that includes three sequential bi-layers of approximately 2.7 Å of Co and approximately 6 Å of Pt, and a single layer of Co that is approximately 5 Å thick. The SAF tri-layer 132 also includes a Ru layer 136 on top of the Co/Pt layer 134 that is approximately 9 Å thick. The SAF tri-layer 132 further includes an upper Co/Pt layer 138 on top of the Ru layer 136 that includes a single layer of Co that is approximately 5 Å thick and also includes four sequential bi-layers of approximately 2.7 Å of Co and approximately 6 Å of Pt. The SAF tri-layer 132 facilitates stabilizing the magnetic moment of the upper $(CoFe)_{80}B_{20}$ layer 128 (i.e., the reference electrode) to a high magnetic field thus making the coercivity of the upper $(CoFe)_{80}B_{20}$ layer 128 significantly higher than the coercivity of the $Mn_3Ge$ layer 120 (the lower, switchable magnetic layer).

In one or more embodiments, the MRAM stack 100 includes a cap layer 140 (shown as 240 in FIG. 2) that is formed from either Ru or a combination of Pt and Ru to extend over either the upper Ta layer 130 or the SAF tri-layer 132 in the vertical direction at approximately room temperature. In some embodiments, the cap layer 140 is formed from approximately 100 Å of Ru. Also, in some embodiments, the capping layer 140 includes one of, or compounds of more than one of, Mo, W, Ta, and Ru.

Referring to FIG. 2, the magnetic layer 228 (shown as the upper $(CoFe)_{80}B_{20}$ layer 128 in FIG. 1) is shown with the respective magnetic moment 250. The spin-transfer torque (STT) effect facilitates the switching of the MTJ 222 (shown as 122 in FIG. 1). More specifically, the magnetic moment 250 of the magnetic layer 228 (also referred to as the upper reference layer and the upper $(CoFe)_{80}B_{20}$ layer 128 (see FIG. 1)) is generally fixed, or pinned, in a particular direction. The magnetic layer 228 has a perpendicular magnetic anisotropy (PMA) energy that exceeds the out-of-plane demagnetization energy. Consequently, the magnetic moment 250 is shown as perpendicular to plane. The magnetic moment 250 of the reference layer 228 is stable in the embodiment shown. Therefore, the magnetic moment 250 is shown as a single-headed arrow. Although shown in a particular direction (toward the top of the page), the magnetic moment 250 may be stable in another direction (e.g., toward the bottom of the page).

The lower free layer, i.e., the Heusler layer 220 (also referred to as the $Mn_3Ge$ layer 120 in FIG. 1 (the lower, switchable magnetic layer)) has a changeable magnetic moment 260. In the embodiment shown, the Heusler layer 220 also has a PMA energy that exceeds the out-of-plane demagnetization energy. Consequently, the magnetic moment 260 is shown as perpendicular to plane. The magnetic moment 260 is programmed to be in one of multiple stable states. Therefore, the magnetic moment 260 is shown as dual-headed arrow. The Heusler layer 220 is used to store information with the data state of either a "1" or a "0," therefore the Heusler layer 220 is sometimes referred to as "the storage layer."

The electrons that define an electric current have the intrinsic quantum mechanics property of spin that is associated with the spin angular momentum of the electrons. To take advantage of the STT effect. the electron spin will have one of two distinct quantum states, i.e., spin-up and spin-down. In general, an electric current is unpolarized, i.e., consisting of approximately 50% spin-up electrons and approximately 50% spin-down electrons. A spin-polarized current is one with more electrons of either spin state. The electrical conductivity features of the MRAM stack 200 above and below the MTJ 222 are used to drive current through the MTJ 222 in a current-perpendicular-to-plane (CPP) direction. Therefore, such MTJs 222 having PMA are advantageous as they require smaller switching currents as compared to in-plane magnetized MTJs.

By passing a current, e.g., current 270 from the substrate 202 through the cap layer 240 and, therefore, through the fixed magnetic layer 228, a spin-polarized current 272 is produced, where the spin-polarization is in the direction of the magnetic moment 250, and where the spin-polarized current 272 has a polarized spin angular momentum. Note that, by convention, the electron flow direction is opposite to the current direction. When this spin-polarized current 272 is directed into the Heusler layer 220, the polarized spin angular momentum is transferred to the Heusler layer 220 such that both magnetic layers, i.e., the fixed magnetic layer 228 and the Heusler layer 220 have the same orientation of the magnetic moment. As such, a torque is applied to the Heusler layer 220 thereby changing its magnetization direction from anti-parallel state to the parallel state if the current flow exceeds the threshold value, i.e., flipping the orientation of the respective magnetic field, i.e., the magnetic moment 260. Flipping the orientation of the magnetic moment 260 from one direction of the arrow 260 to the opposite direction will flip the data state of the Heusler layer 220, sometimes referred to "toggling the Heusler layer upward." In the present case, the resulting orientation of the magnetic moment 260 of the Heusler layer 220 will be upward, i.e., parallel to that of the fixed magnetic moment 250, thereby defining a low resistance to current flow in the Heusler layer 220.

The direction of the current flow through the MRAM stack 200 is typically reversible, e.g., as shown by current 280. By passing the current 280 from the cap layer 240 towards the substrate 202 and, therefore, through the fixed magnetic layer 228, a spin-polarized current 282 is produced, where the spin-polarization is opposite to the direction of the magnetic moment 250, and where the spin-polarized current 282 has a polarized spin angular momentum opposite to that for the spin-polarized current 272. When this spin-polarized current 282 is directed into the Heusler layer 220, the polarized spin angular momentum is transferred to the Heusler layer 220, both magnetic layers, i.e., the fixed magnetic layer 228 and the Heusler layer 220 have opposite orientation of the magnetic moment. As such, a torque is applied to the Heusler layer 220 thereby changing its magnetization direction from the parallel state to the anti-parallel state if the current flow exceeds the threshold value, i.e., flipping the orientation of the respective magnetic field, i.e., the magnetic moment 260. Flipping the orientation of the magnetic moment 260 from one direction of the arrow 260 to the opposite direction will flip the data state of the Heusler layer 220, sometimes referred to "toggling the Heusler layer downward." In the present case, the resulting orientation of the magnetic moment 260 of the will be downward, i.e., anti-parallel to that of the fixed magnetic moment 250, thereby defining a high resistance to current flow in the Heusler layer 220. Accordingly, different current directions define different spin-polarized currents to generate different magnetic configurations corresponding to different resistances and thus different logical states, e.g., a logical "0" and a logical "1" of the MTJ 222.

Figure 3:
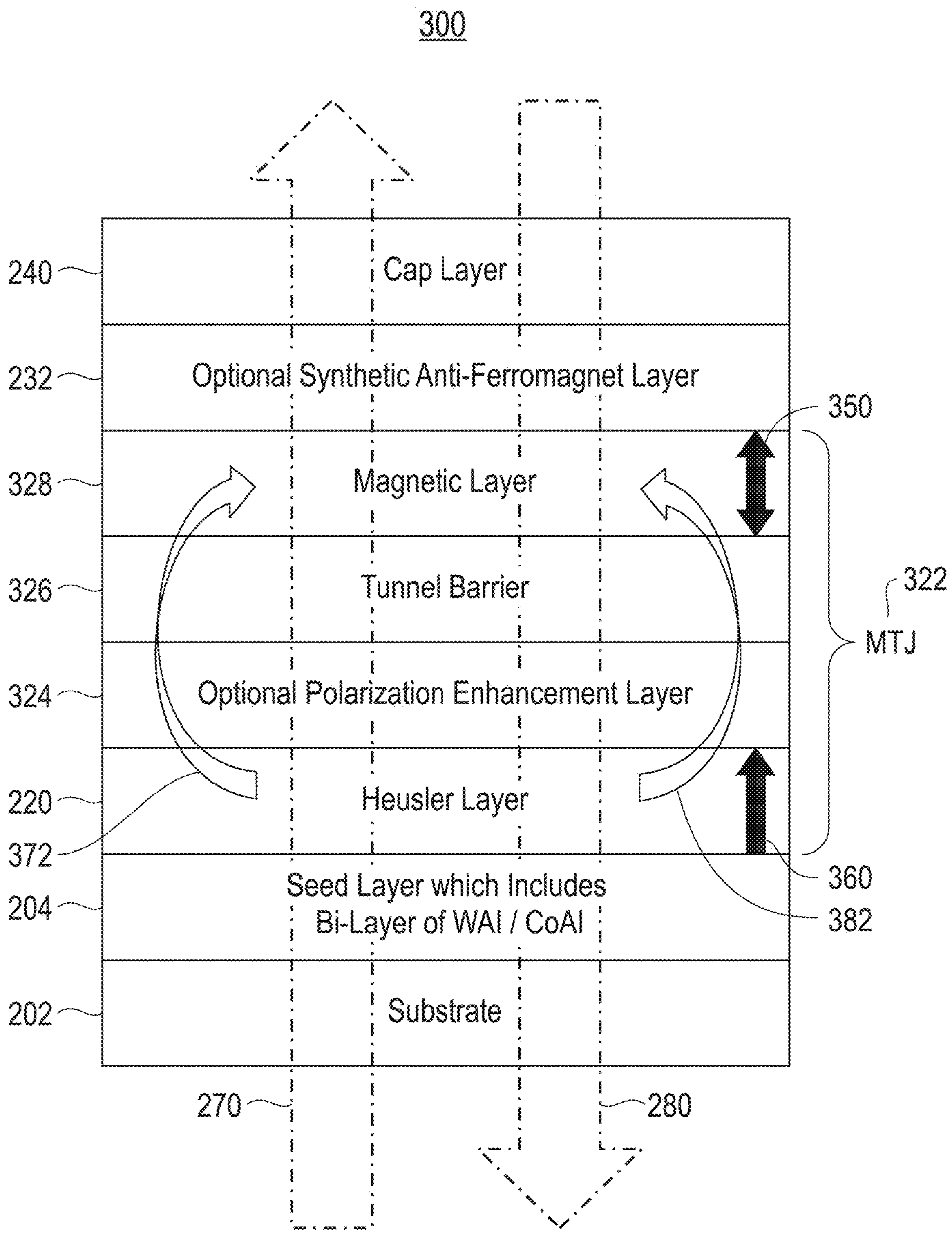
FIG. 3 is a simplified block schematic diagram illustrating portions of the MRAM stack of FIGS. 1 and 2 and the respective magnetic moments, in accordance with some embodiments of the present disclosure.

Referring to FIG. 3, a simplified block schematic diagram is presented illustrating portions of the MRAM stack 300 (shown as the MRAM stack 100 and 200 in FIGS. 1 and 2, respectively) and the respective magnetic moments, in accordance with some embodiments of the present disclosure. Similar components in FIGS. 1, 2, and 3 have similar numbering, and the unaffected components of FIG. 3 retain the numbering from FIG. 2.

In at least some embodiments, the MRAM stack 300 of FIG. 3 differs from the MRAM stack 200 of FIG. 2 in that the MTJ 322 is modified. Specifically, the Heusler layer 320 is the set reference layer with the set magnetic moment 360 and the magnetic layer 328 is the switchable magnetic layer with the switchable magnetic moment 350, and therefore, the magnetic layer 328 assumes the role of the storage layer. As such, the directions of the spin-polarized current 372 and the spin-polarized current 382 are reversed from their counterparts of spin-polarized current 272 and the spin-polarized current 282, respectively, from FIG. 2. Otherwise, the operation of the MRAM stack 300 is substantially similar to that for the MRAM stack 200 (see FIG. 2) subject to the reversal of the roles of the magnetic layer 228/328 and the Heusler layer 220/320 as indicated through the directions of the arrows for magnetic moments 350 and 360 in comparison with the magnetic moments 250 and 260, respectively.

Accordingly, referring to FIGS. 2 and 3, regardless of the configuration of which magnetic layer is the storage layer and which magnetic layer is the reference layer, the desired increases in TMR is at least partially due to the enhancements to the spin polarization of the Heusler layer 220.

Figure 4:
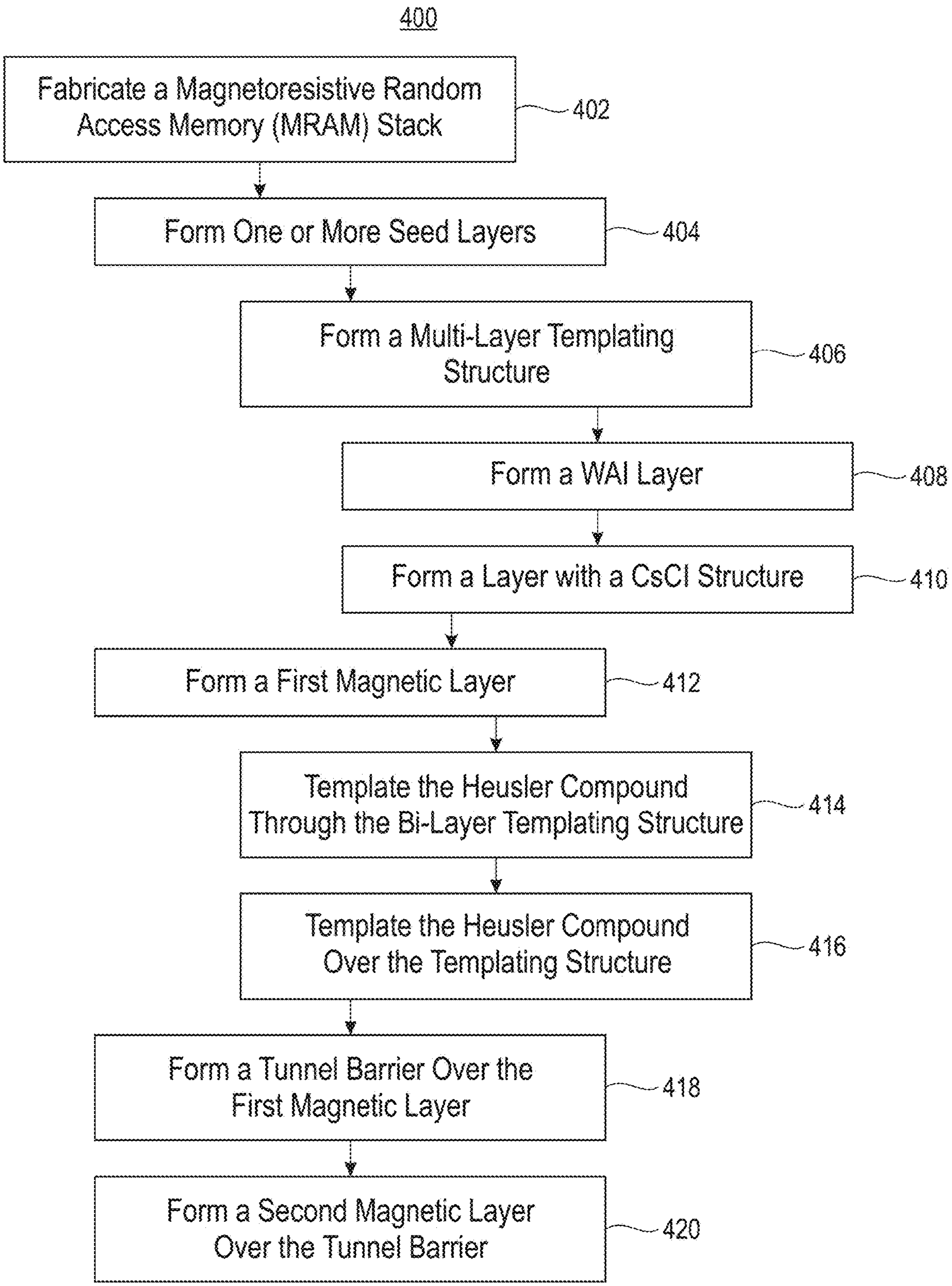
FIG. 4 is a flowchart illustrating a process for fabricating a MRAM device, in accordance with some embodiments of the present disclosure.

Referring to FIG. 4, a flowchart is presented illustrating a process 400 for fabricating 402 a MRAM stack 100 (see FIG. 1), in accordance with some embodiments of the present disclosure. Also referring to FIG. 1, one or more seed layers 104 are formed 404, including forming 406 a multi-layer templating structure 118 that is not necessarily limited to a bi-layered structure and in some embodiments is a single layer structure and in some embodiments is a multilayer structure of CsCl-like chemical templating compounds, including a crystalline structure. In some embodiments, the forming 406 the multi-layer templating structure 118 includes positioning the multi-layer templating structure 118 above the substrate 102. The multi-layer templating structure 118 includes a crystalline structure configured to enhance the tunnel magnetoresistance (TMR) of the MRAM stack 100. The forming step 406 includes forming 408 a layer 114 of a first binary alloy including tungsten-aluminum (WAl), and forming 410 a layer of a second binary alloy having a cesium-chloride (CsCl) structure, wherein the second binary alloy overlays the first binary alloy, i.e., the CoAl layer 116 overlays the WAl layer 114.

In at least some embodiments, the process 400 for fabricating 402 a MRAM stack 100 also includes forming 412 the first magnetic layer 120. Forming 412 the first magnetic layer 120 includes templating 414 a Heusler compound through the templating structure 118. The Heusler compound has a perpendicular magnetic anisotropy (PMA) energy exceeding an out-of-plane demagnetization energy, and is configured to enhance the TMR of the MRAM stack 100 through enhancement of the spin polarization of the Heusler compound. Moreover, the forming 412 the first magnetic layer 120 further includes templating 416 the Heusler compound over the templating structure 118.

The process 400 for fabricating 402 a MRAM stack 100 further includes forming 418 a tunnel barrier 126 over the first magnetic layer 120, and forming 420 a second magnetic layer 128 over the tunnel barrier 126, thereby positioning the tunnel barrier 126 between, and in contact with, the first magnetic layer 120 and the second magnetic layer 128. Additional details of the fabrication process 400 are presented in the discussion of the individual layers of the MRAM stack 100 with respect to FIG. 1.

Figure 5:
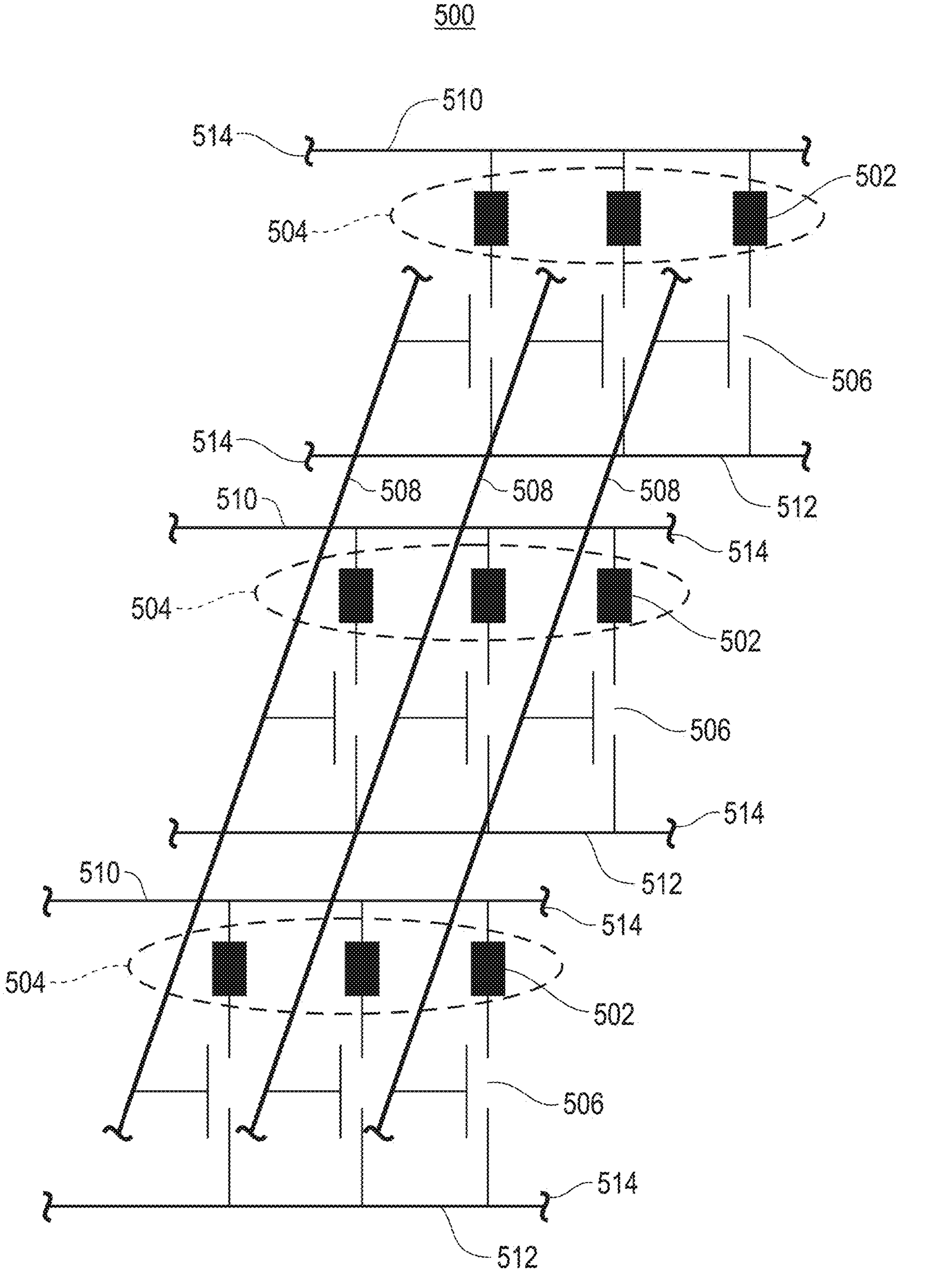
FIG. 5 is a block schematic diagram illustrating a MRAM array, in accordance with some embodiments of the present disclosure.

Referring to FIG. 5, a block schematic diagram is presented illustrating a MRAM array 500, in accordance with some embodiments of the present disclosure. Specifically, FIG. 5 presents an array 500 of MRAM cells 502, where only three of the nine shown MRAM cells 502 are labeled for clarity. In some embodiments, the plurality of MRAM cells 502 are arranged in respective cell locations 504. In some embodiments, each MRAM cell 502 includes one or more MRAM stacks 100 (see FIG. 1). Each MRAM cell 502 is connected to a respective transistor 506 that controls reading and writing, where only three of the nine shown transistors 506 are labeled for clarity. In one or more embodiments, a word line 508 provides data to write to the MRAM cells 502, while a bit line 510 and a bit line complement 512 read data from the MRAM cell 502. In this manner, a large array 500 of MRAM cells 502 can be implemented on a single chip (not shown). An arbitrarily large number of MRAM cells 502 can be employed, within the limits of the manufacturing processes and design specifications.

In some embodiments, the operation of the MRAM array 500 includes writing data to a MRAM cell 502 includes passing a current (not shown) through the MRAM cell 502. This current causes the direction of magnetization to switch between a parallel or anti-parallel state, which has the effect of switching between low resistance and high resistance states. Because this effect can be used to represent the subsets of ones and zeroes of digital information, the MRAM cells 502 can be used as a non-volatile memory (see FIG. 6).

Also, referring to FIGS. 1, 2, and 3, passing the current in one direction through the MRAM cell 502 causes the magnetization of the free layer 120/220/320 to be parallel with that of the reference layer 128/228/328, while passing the current in the opposite direction through the MRAM cell 502 causes the magnetization of the free layer 120/220/320 to be anti-parallel to that of the reference layer 128/228/328. Reading the bit stored in a MRAM cell 502 involves applying a voltage (lower than that used for writing information) to the MRAM cell 502 to discover whether the cell offers high resistance to current ("1") or low resistance ("0").

In at least some embodiments, the plurality of bit lines 510 and a plurality of complementary bit lines 512 defines a plurality of bit line-complementary bit line pairs 514. A plurality of word lines 508 intersect the plurality of bit line pairs 514 at a plurality of cell locations 504. The plurality of MRAM cells 502 are located at one of each of the plurality of cell locations 504. Each of the MRAM cells 502 is electrically connected to a corresponding bit line 510 and selectively interconnected to a corresponding one of the complementary bit lines 512 under control of a corresponding one of the word lines 508. In some embodiments, e.g., without limitation, a respective transistor 506 is a field effect transistor turned off or on by a signal from the respective word line 508 applied to its gate, which controls reading and writing and whether the cell is coupled to the complementary bit lines 512. Accordingly, each word line 508 of the plurality of word lines 508 is configured to receive one or more signals to cause a first subset of the plurality of MRAM cells 502 to store logical ones and a second subset of the plurality of cells to store logical zeroes. Also, accordingly, each bit line-complementary bit line pair 514 of the plurality of bit line-complementary bit line pairs 514 is configured to read the stored logical ones and stored logical zeroes resident within the respective subsets.

Figure 6:
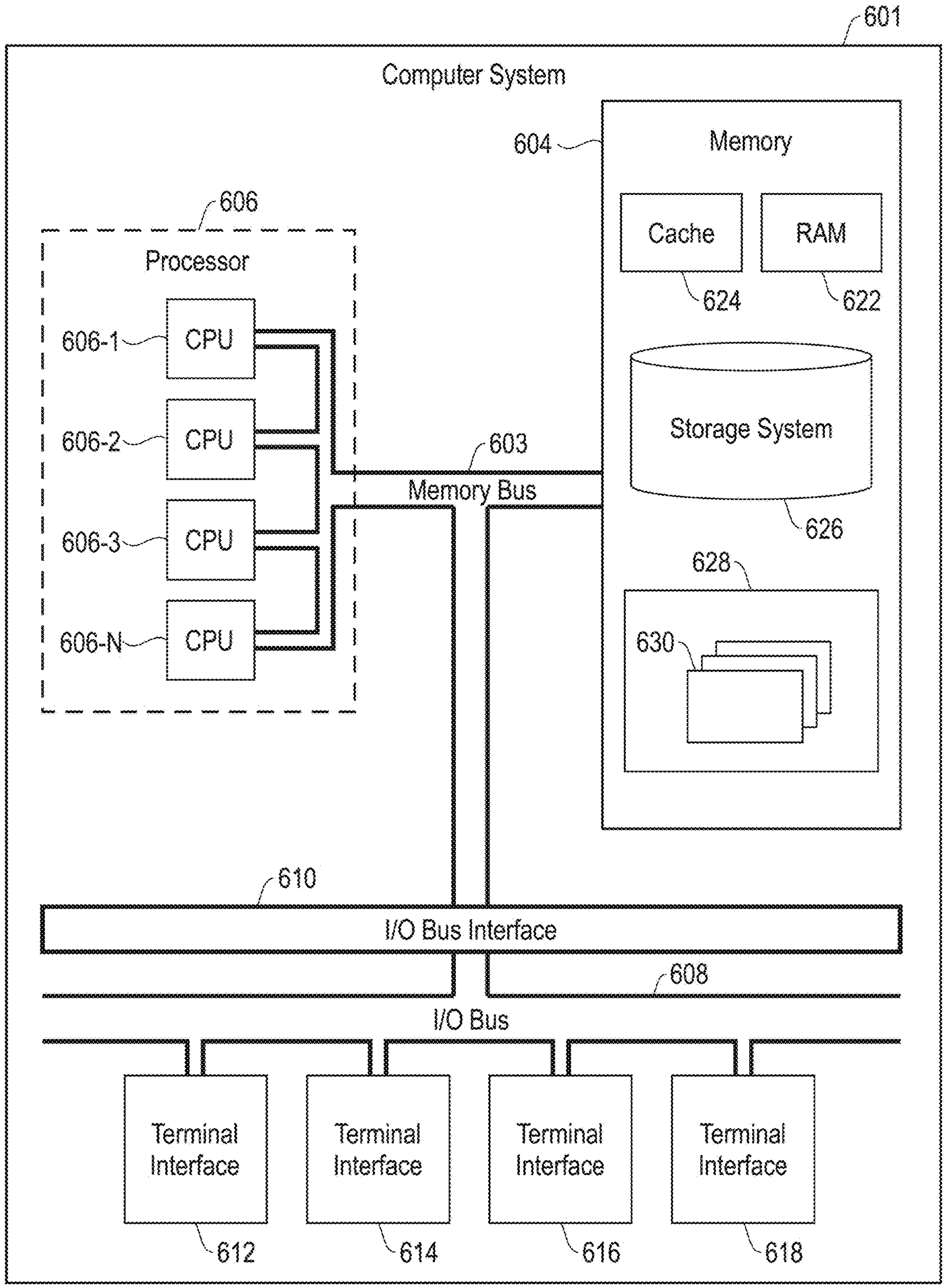
FIG. 6 is a block schematic diagram illustrating a computing system, in accordance with some embodiments of the present disclosure.

Referring now to FIG. 6, a block schematic diagram is provided illustrating a computing system 601 that may be used in implementing one or more of the methods, tools, and modules, and any related functions, described herein (e.g., using one or more processor circuits or computer processors of the computer), in accordance with some embodiments of the present disclosure. In some embodiments, the major components of the computer system 601 may comprise one or more CPUs 602, a memory subsystem 604, a terminal interface 612, a storage interface 616, an I/O (Input/Output) device interface 614, and a network interface 618, all of which may be communicatively coupled, directly or indirectly, for inter-component communication via a memory bus 603, an I/O bus 608, and an I/O bus interface unit 610.

The computer system 601 may contain one or more general-purpose programmable central processing units (CPUs) 602-1, 602-2, 602-3, 602-N, herein collectively referred to as the CPU 602. In some embodiments, the computer system 601 may contain multiple processors typical of a relatively large system; however, in other embodiments the computer system 601 may alternatively be a single CPU system. Each CPU 602 may execute instructions stored in the memory subsystem 604 and may include one or more levels of on-board cache.

System memory 604 may include computer system readable media in the form of volatile memory, such as random access memory (RAM) 622 or cache memory 624. Computer system 601 may further include other removable/non-removable, volatile/non-volatile computer system storage media. By way of example only, storage system 626 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 604 can include flash memory, e.g., a flash memory stick drive or a flash drive. Moreover, the non-volatile STT-MRAM devices as described herein are included as a portion of the described suite of memory devices. Memory devices can be connected to memory bus 603 by one or more data media interfaces. The memory 604 may include at least one program product having a set (e.g., at least one) of program modules that are configured to carry out the functions of various embodiments.

Although the memory bus 603 is shown in FIG. 6 as a single bus structure providing a direct communication path among the CPUs 602, the memory subsystem 604, and the I/O bus interface 610, the memory bus 603 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 610 and the I/O bus 608 are shown as single respective units, the computer system 601 may, in some embodiments, contain multiple I/O bus interface units 610, multiple I/O buses 608, or both. Further, while multiple I/O interface units are shown, which separate the I/O bus 608 from various communications paths running to the various I/O devices, in other embodiments some or all of the I/O devices may be connected directly to one or more system I/O buses.

In some embodiments, the computer system 601 may be a multi-user mainframe computer system, a single-user system, or a server computer or similar device that has little or no direct user interface, but receives requests from other computer systems (clients). Further, in some embodiments, the computer system 601 may be implemented as a desktop computer, portable computer, laptop or notebook computer, tablet computer, pocket computer, telephone, smart phone, network switches or routers, or any other appropriate type of electronic device.

It is noted that FIG. 6 is intended to depict the representative major components of an exemplary computer system 601. In some embodiments, however, individual components may have greater or lesser complexity than as represented in FIG. 6, components other than or in addition to those shown in FIG. 6 may be present, and the number, type, and configuration of such components may vary.

One or more programs/utilities 628, each having at least one set of program modules 630 may be stored in memory 604. The programs/utilities 628 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Programs 628 and/or program modules 630 generally perform the functions or methodologies of various embodiments.

The embodiments as disclosed and described herein are configured to provide an improvement to computer technology. Materials, operable structures, and techniques as disclosed herein can provide substantial beneficial technical effects. Some embodiments may not have all of these potential advantages and these potential advantages are not necessarily required of all embodiments. By way of example only, and without limitation, one or more embodiments may provide enhancements of the value of the tunnel magnetoresistance (TMR) for the respective MRAM stacks through the cooperation of the $Mn_xN$ layer, the WAl layer, and the CoAl layer.

As described above, high TMR is desirable since the higher TMR provides a higher ON/OFF ratio and a greater signal-to-noise ratio of the respective memory cells. At least some of the embodiments described herein are directed toward fabrication enhancements to the memory stacks to enhance the polarization of the electron spin by overcoming the technical limitations present in the state-of-the-art memory stack fabrication processes. Such spin polarization enhancements of the Heusler compound also enhance the associated TMR as well. In some embodiments, the templating layer has a bi-layer structure, e.g., the WAl layer and the CoAl layer. However, the templating layer is not necessarily limited to a bi-layered structure and in some embodiments is a single layer structure and in some embodiments is a multilayer structure of CsCl-like chemical templating compounds, such as, and without limitation, CoAl, CoGa, CoGe, IrAl, RuAl, and the like. Accordingly, as disclosed herein in at least some of the embodiments, upward improvements of the TMR of the Heusler compounds are implemented to enhance the performance of the MTJs.

In addition, substituting W for Ir in the bi-layered structure results in a material layer of WAl that is functionally similar to a layer of IrAl with respect to enhancing the TMR of the MRAM stack over that of CoAl alone, where W is relatively inexpensive and readily available and is more "fabrication friendly" than Ir (as previously described herein).

In addition, further improvement of computer technology is achieved through using fabricating multiple MRAM stacks to define a MRAM cell, where a plurality of MRAM cells further define a MRAM array. The MRAM arrays are a used to build a non-volatile MRAM device, and one or more MRAM devices will define a computing system. The overall effect of an extremely large number of MRAM stacks drawing less electrical energy due to their non-volatility (i.e., no power needed to maintain the stored state) will result in a reduction in power consumption of the computer systems.

The present disclosure may be a system, a method, and/or a computer program product at any possible technical detail level of integration. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD- ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a wave-guide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A magnetic random access memory (MRAM) stack comprising:

a first magnetic layer comprising a Heusler compound having perpendicular magnetic anisotropy; and one or more seed layers comprising:

a multi-layer templating structure comprising a crystalline structure configured to template the Heusler compound and enhance a tunnel magnetoresistance (TMR) of the MRAM stack through enhancement of spin polarization of the Heusler compound by improvement of chemical ordering and crystallinity of the Heusler compound, wherein the first magnetic layer is formed over the multi-layer templating structure, the multi-layer templating structure comprising:

a first layer comprising a binary alloy having a cesium-chloride (CsCl) structure;

a layer of a first binary alloy comprising tungsten-aluminum (WAl); and a second layer comprising a second binary alloy having a cesium-chloride (CsCl) structure formed over the WAl layer, wherein the second layer comprising the second binary alloy having the CsCl structure is configured to induce tetragonal distortion of the Heusler compound such that magnetization of the first magnetic layer is oriented perpendicular to a film plane of the first magnetic layer.

2. The MRAM stack of claim 1 further comprising:

a second magnetic layer; and a tunnel barrier positioned between, and in contact with, one or more of the first magnetic layer and the second magnetic layer, wherein:

the first magnetic layer comprises a storage layer;

the second magnetic layer comprises a reference layer; and the first magnetic layer, the tunnel barrier, and the second magnetic layer define a magnetic tunnel junction (MTJ).

3. The MRAM stack of claim 2, wherein:

the tunnel barrier is formed from compounds selected from the group consisting of MgO and $Mg_{1-z}Al_{2+(2/3)z}O_4$, wherein $-0.5<z<0.5$.

4. The MRAM stack of claim 1 further comprising:

a second magnetic layer; and a tunnel barrier positioned between, and in contact with, one or more of the first magnetic layer and the second magnetic layer, wherein:

the second magnetic layer comprises a storage layer;

the first magnetic layer comprises a reference layer; and the first magnetic layer, the tunnel barrier, and the second magnetic layer define a magnetic tunnel junction (MTJ).

5. The MRAM stack of claim 1, wherein the first magnetic layer has magnetization which is oriented perpendicular to a thickness direction of the first magnetic layer due at least in part to tetragonal distortion induced by the multi-layer templating structure, and the a thickness less than 5 nanometers (nm).

6. The MRAM stack of claim 1, wherein the first magnetic layer is formed from compounds of $Mn_3Z$, wherein:

Z is an element selected from the group consisting of germanium (Ge), tin (Sn), and antimony (Sb); and the compounds of $Mn_3Z$ are selected from the group consisting of $Mn_{3.3-x}Ge$, $Mn_{3.3-x}Sn$, and $Mn_{3.3-x}Sb$, x in a range from 0 to 1.1.

7. The MRAM stack of claim 1, wherein the Heusler compound is a ternary Heusler compound selected from the manganese-cobalt-tin group consisting of $Mn_{3.3-x}Co_{1.1-y}Sn$, in which $x \leq 1.2$ and $y \leq 1.0$.

8. The MRAM stack of claim 1, wherein the Heusler compound is chosen from the group consisting of $Mn_3Al$, $Mn_3Ga$, $Mn_3In$, $Mn_2FeSb$, $Mn_3CoAl$, $Mn_2CoGe$, $Mn_2CoSi$, $Mn_2CuSi$, $Mn_2CoSn$, $Co_2CrAl$, $Co_2CrSi$, $Co_2MnSb$, and $Co_2MnSi$.

9. The MRAM stack of claim 1, wherein the Heusler compound is $Mn_3Ge$.

10. The MRAM stack of claim 1, wherein the multi-layer templating structure comprises:

a plurality of materials having the CsCl structure with a (001) orientation configured to promote ordered growth of the Heusler compound.

11. The MRAM stack of claim 10, wherein the second binary alloy having the CsCl structure comprises:

a CsCl structure as represented by $A_{1-x}E_x$, wherein A is a transition metal element and E is a main group element, with x being in a range from 0.45 to 0.55.

12. The MRAM stack of claim 11, wherein:

the multi-layer templating structure comprises cobalt-aluminum (CoAl), and wherein the second binary alloy having the CsCl structure comprises alternating atomic planes of the transition metal element and the main group element.

13. A method of fabricating a magnetic random access memory (MRAM) stack comprising:

forming one or more seed layers comprising:

forming a multi-layer templating structure above a substrate, wherein the multi-layer templating structure includes a crystalline structure configured to enhance a tunnel magnetoresistance (TMR) of the MRAM stack through enhancement of spin polarization of a Heusler compound by improvement of chemical ordering and crystallinity of the Heusler compound, wherein the forming the multi-layer templating structure comprises:

forming a first layer comprising a binary alloy having a cesium-chloride (CsCl) structure;

forming a layer of a first binary alloy including tungsten-aluminum (WAl) over the first layer; and forming a layer of a second binary alloy having a cesium-chloride (CsCl) structure over the WAl layer; and forming a first magnetic layer comprising:

templating a Heusler compound through the multi-layer templating structure such that the Heusler compound exhibits perpendicular magnetic anisotropy due at least in part to tetragonal distortion induced by the multi-layer templating structure.

14. The method of claim 13, further comprising:

templating the Heusler compound over the multi-layer templating structure with a (001) orientation.

15. The method of claim 13, further comprising:

forming a tunnel barrier over the first magnetic layer; and forming a second magnetic layer over the tunnel barrier, thereby positioning the tunnel barrier between, and in contact with, the first magnetic layer and the second magnetic layer, wherein:

the first magnetic layer defines a storage layer;

the second magnetic layer define a reference layer; and the first magnetic layer, the tunnel barrier, and the second magnetic layer define a magnetic tunnel junction (MTJ).

16. The method of claim 13, further comprising:

forming a tunnel barrier over the first magnetic layer; and forming a second magnetic layer over the tunnel barrier, thereby positioning the tunnel barrier between, and in contact with, the first magnetic layer and the second magnetic layer, wherein:

the second magnetic layer defines a storage layer;

the first magnetic layer define a reference layer; and the first magnetic layer, the tunnel barrier, and the second magnetic layer define a magnetic tunnel junction (MTJ).

17. The method of claim 13, wherein the forming the layer of the second binary alloy having the CsCl structure comprises one or more of:

forming the CsCl structure as represented by $A_{1-x}E_x$, wherein A is a transition metal element and E is a main group element, with x being in a range from 0.45 to 0.55;

forming the multi-layer templating structure with a binary alloy including cobalt-aluminum (CoAl); and forming the multi-layer templating structure with alternating atomic planes of the transition metal element and the main group element.

18. The method of claim 13, wherein the templating the Heusler compound comprises one or more of:

templating the first magnetic layer from compounds of $Mn_3Z$, wherein:

Z is an element selected from the group consisting of germanium (Ge), tin (Sn), and antimony (Sb); and templating the first magnetic layer where the compounds of $Mn_3Z$ are selected from the group consisting of $Mn_{3.3-x}Ge$, $Mn_{3.3-x}Sn$, and $Mn_{3.3-x}Sb$, x in a range from 0 to 1.1.

19. The method of claim 13, wherein the templating the Heusler compound comprises one or more of:

templating the first magnetic layer from a ternary Heusler compound selected from the manganese-cobalt-tin group consisting of $Mn_{3.3-x}Co_{1.1-y}Sn$, in which $x \leq 1.2$ and $y \leq 1.0$;

templating the first magnetic layer from the Heusler compound chosen from the group consisting of $Mn_3Al$, $Mn_3Ga$, $Mn_3In$, $Mn_2FeSb$, $Mn_3CoAl$, $Mn_2CoGe$, $Mn_2CoSi$, $Mn_2CuSi$, $Mn_2CoSn$, $Co_2CrAl$, $Co_2CrSi$, $Co_2MnSb$, and $Co_2MnSi$; and templating the first magnetic layer from the Heusler compound of $Mn_3Ge$.

20. A magnetic random-access memory (MRAM) array, comprising:

a plurality of bit lines and a plurality of corresponding complementary bit lines forming a plurality of bit line-complementary bit line pairs;

a plurality of word lines intersecting the plurality of bit line pairs at a plurality of cell locations;

a plurality of MRAM cells located at each cell location of the plurality of cell locations, each MRAM cell of the plurality of MRAM cells being electrically connected to a corresponding bit line of the plurality of bit lines and selectively interconnected to a corresponding one of the plurality of the complementary bit lines under control of a corresponding one of the word lines of the plurality of word lines, each MRAM cell of the plurality of MRAM cells comprising:

a first magnetic layer comprising a Heusler compound having perpendicular magnetic anisotropy; and one or more seed layers comprising:

a multi-layer templating structure comprising a crystalline structure configured to template the Heusler compound and enhance a tunnel magnetoresistance (TMR) of each MRAM cell of the plurality of MRAM cells through enhancement of spin polarization of the Heusler compound by improvement of chemical ordering and crystallinity of the Heusler compound, wherein the first magnetic layer is formed over the multi-layer templating structure, the multi-layer templating structure comprising:

a first layer comprising a binary alloy having a cesium-chloride (CsCl) structure;

a layer of a first binary alloy comprising tungsten-aluminum (WAl) formed over the first layer; and a second layer of comprising a second binary alloy having a cesium-chloride (CsCl) structure formed over the WAl layer.

21. The MRAM array of claim 20 further comprising:

a second magnetic layer; and a tunnel barrier positioned between, and in contact with, one or more of the first magnetic layer and the second magnetic layer, wherein:

the first magnetic layer comprises one of a storage layer and a reference layer;

the second magnetic layer comprises one of a reference layer and a storage layer in opposition to the first magnetic layer; and the first magnetic layer, the tunnel barrier, and the second magnetic layer define a magnetic tunnel junction (MTJ).

22. The MRAM array of claim 20, wherein:

each word line of the plurality of word lines is configured to receive one or more signals to cause a first subset of the plurality of MRAM cells to store logical ones and a second subset of the plurality of MRAM cells to store logical zeroes; and each bit line-complementary bit line pair of the plurality of bit line-complementary bit line pairs is configured to read the stored logical ones and zeroes.

23. A computer system comprising:

one or more processing devices; and one or more memory devices communicatively and operably coupled to the one or more processing devices, at least one memory device of the one or more memory devices comprising one or more magnetic random access memory (MRAM) devices, each MRAM device of the one or more MRAM devices comprising:

a first magnetic layer comprising a Heusler compound having perpendicular magnetic anisotropy; and one or more seed layers comprising:

a multi-layer templating structure comprising a crystalline structure configured to template the Heusler compound and enhance a tunnel magnetoresistance (TMR) of each MRAM device of the one or more MRAM devices through enhancement of spin polarization of the Heusler compound by improvement of chemical ordering and crystallinity of the Heusler compound, wherein the first magnetic layer is formed over the multi-layer templating structure, the multi-layer templating structure comprising:

a first layer comprising a binary alloy having a cesium-chloride (CsCl) structure;

a layer of a first binary alloy comprising tungsten-aluminum (WAl) formed over the first layer; and a second layer comprising a second binary alloy having a cesium-chloride (CsCl) structure formed over the WAl layer.

24. The computer system of claim 23, wherein the each MRAM device of the one or more MRAM devices further comprises:

a second magnetic layer; and a tunnel barrier positioned between, and in contact with, one or more of the first magnetic layer and the second magnetic layer, wherein:

the first magnetic layer comprises one of a storage layer and a reference layer;

the second magnetic layer comprises one of a reference layer and a storage layer in opposition to the first magnetic layer; and the first magnetic layer, the tunnel barrier, and the second magnetic layer define a magnetic tunnel junction (MTJ).

25. A magnetic random-access memory (MRAM) device, comprising:

a plurality of MRAM stacks, each MRAM stack of the plurality of MRAM stacks comprising:

a first magnetic layer comprising a Heusler compound having perpendicular magnetic anisotropy; and one or more seed layers comprising:

a multi-layer templating structure comprising a crystalline structure configured to template the Heusler compound and enhance a tunnel magnetoresistance (TMR) of each MRAM stack of the plurality of MRAM stacks through enhancement of spin polarization of the Heusler compound by improvement of chemical ordering and crystallinity of the Heusler compound, wherein the first magnetic layer is formed over the multi-layer templating structure, the multi-layer templating structure comprising:

a first layer comprising a binary alloy having a cesium-chloride (CsCl) structure;

a layer of a first binary alloy comprising tungsten-aluminum (WAl) formed over the first layer; and a layer of a second binary alloy having a cesium-chloride (CsCl) structure formed over the WAl layer.

* * * * *